United States Patent [19]

Myers

[11] 4,152,712
[45] May 1, 1979

[54] OPTOELECTRONIC DISPLAYS USING UNIFORMLY SPACED ARRAYS OF SEMISPHERE LIGHT EMITTING DIODES AND METHOD OF FABRICATING SAME

[75] Inventor: David J. Myers, Plano, Tex.

[73] Assignee: Texas Instruments Incorporated, Dallas, Tex.

[21] Appl. No.: 834,630

[22] Filed: Sep. 19, 1977

[51] Int. Cl.² .......................................... H01L 33/00
[52] U.S. Cl. ...................................... 357/17; 357/20; 313/499; 313/500
[58] Field of Search ........................... 357/30, 17, 20; 313/499, 500

[56] References Cited

U.S. PATENT DOCUMENTS

| 3,040,416 | 6/1962 | Matlow et al. | 29/155.5 |
| 3,263,110 | 7/1966 | Berg | 313/108 |
| 3,271,631 | 9/1966 | Marinace | 317/234 |
| 3,391,287 | 7/1968 | Kao | 307/302 |
| 3,443,166 | 5/1969 | Ing, Jr. et al. | 317/234 |

Primary Examiner—Martin H. Edlow
Attorney, Agent, or Firm—James T. Comfort; Gary C. Honeycutt

[57] ABSTRACT

Light emitting diodes in a substantially semispherical form having an outer shell-like region of semiconductor material of one conductivity type and a subsurface body of semiconductor material of an opposite conductivity type forming a p-n junction are mounted to a surface of an insulating substrate member extending therefrom to allow a portion of each diode element to protrude past the outer surface of the substrate. Metallic coatings are provided on both the outer shell-like semiconductor material having one conductivity and a second metallic coating is provided on the subsurface body semiconductor material having a second conductivity for electrical contact. A transparent conductive material is further disposed over the diode structure connecting diodes formed in an array.

18 Claims, 12 Drawing Figures

U.S. Patent    May 1, 1979    Sheet 1 of 3    4,152,712
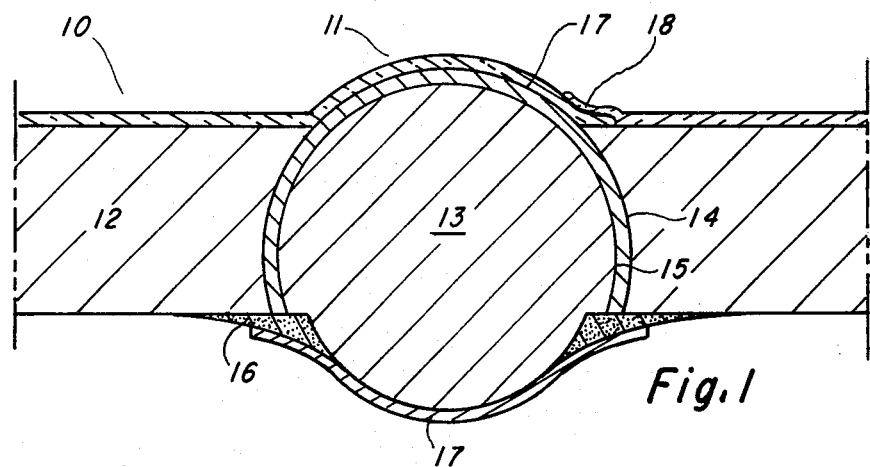
Fig. 1
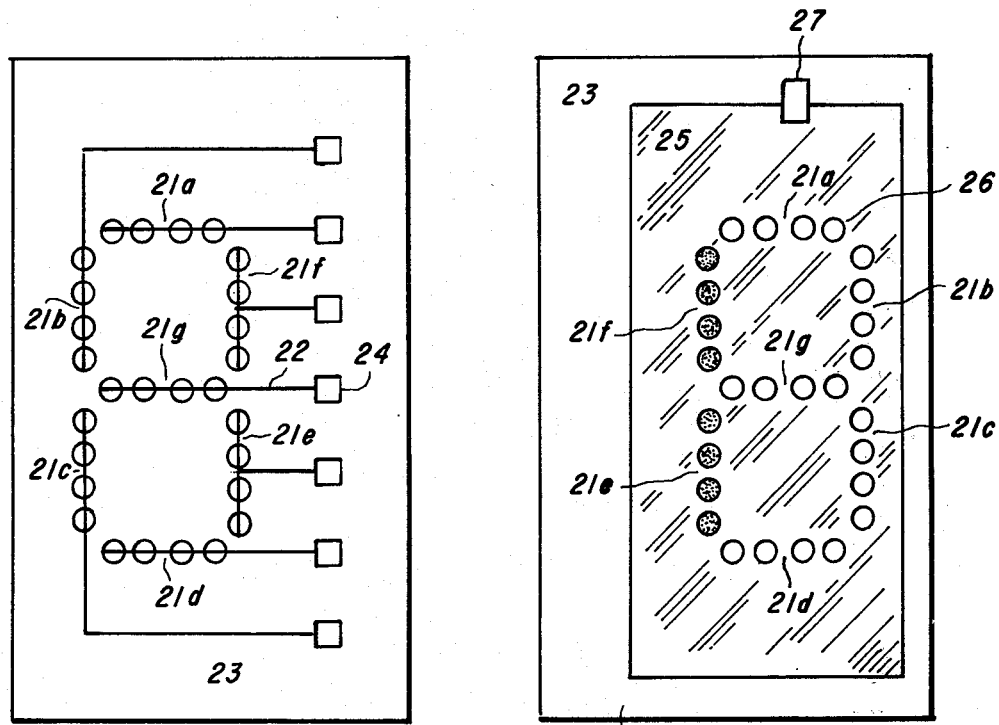
Fig. 2A
Fig. 2B

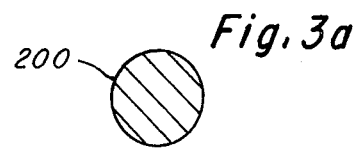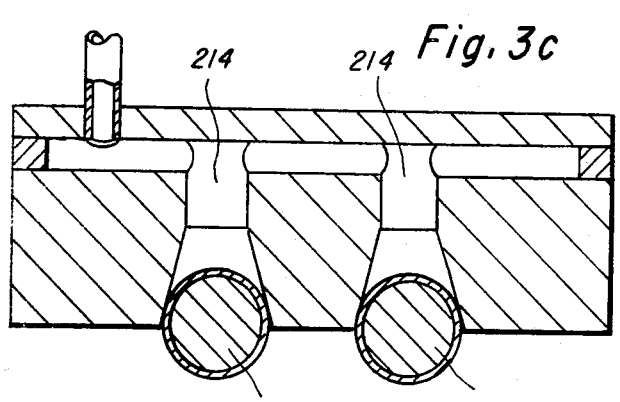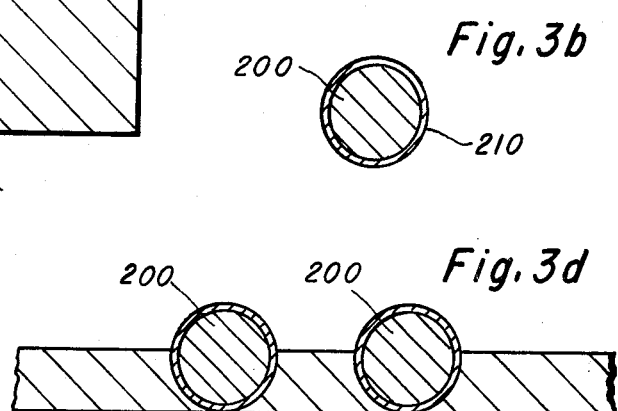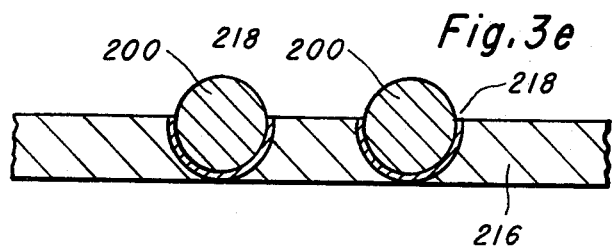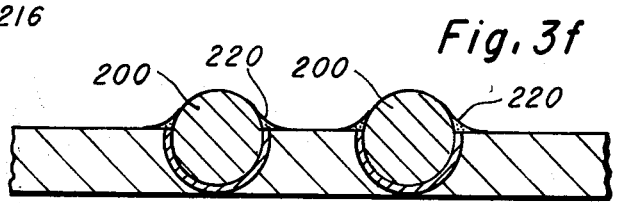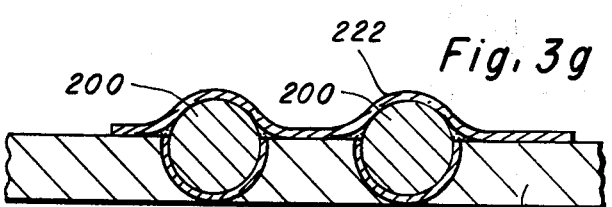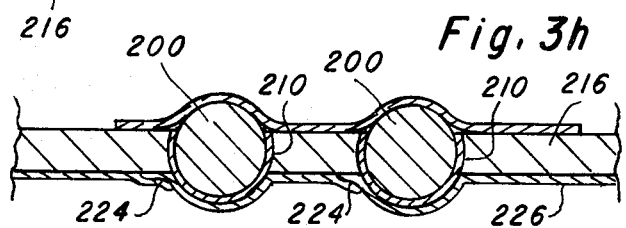

OPTOELECTRONIC DISPLAYS USING UNIFORMLY SPACED ARRAYS OF SEMISPHERE LIGHT EMITTING DIODES AND METHOD OF FABRICATING SAME

This invention relates to alphanumeric character displays and more particularly to a regular array of semispherical light emitting diodes imbedded in an insulating matrix to form a display.

BACKGROUND OF THE INVENTION

It has long been known that forward biased p-n junctions in certain compound semiconductor materials will emit light. Semiconductor p-n junction diodes have been arranged in arrays to provide alphanumeric, character, or seven segment displays. Such arrays as previously produced were relatively expensive since they involved producing the diode junction structure on a large slice of material which was thereafter cut or broken into a large number of individual diodes, thus electrically isolating them from each other, and then reassembling the diodes into arrays for arrangements to provide the characters desired. Finally, individual wire connections had to be accomplished to at least one electrode of each diode. Further, planar processing is complicated, and the resulting planar geometry is not optimum for emitting light because of internal reflection. Element nonuniformity, misalignment and bad connections cause a high percentage of rework or rejection in conventional light emitting diodes (LEDs). This fact, coupled with the labor intensive nature of the process involved as well as its inherently high rated material waste, made LED displays relatively expensive to produce, and made it difficult to fabricate large displays having good resolution (a high number of lighted points per unit area).

Other displays, such as liquid crystal displays and electrochromic displays, typically require ambient light to be visible, and are likely to have problems as to service life-time and to be temperature sensitive. Electroluminescent displays require high voltage as do plasma displays.

To overcome the weaknesses of the conventional LED display, a light emitting diode taking the form of a sphere or spheroid has been used. In pending U.S. Application Ser. No. 752,389 filed Dec. 20, 1976 and entitled "Light Emitting Diode Element in Character Display" by G. F. Wakefield, a spherical light emitting element having a multilayer sphere of different materials forming a subsurface p-n junction inserted into an insulation member is disclosed.

SUMMARY OF THE INVENTION

The present invention further overcomes the weaknesses of the conventional light emitting diode displays by providing individual light emitting diodes having a body of a compound semiconductor material doped so as to have a first conductivity and including first and second spherical sections with said first spherical section being of larger diameter as compared to the second spherical section. An outer region of the larger first spherical section is diffused with an appropriate dopant so as to have a second conductivity different from the conductivity of the first and second spherical body sections, thereby providing a p-n junction of substantially semispherical shape. First and second ohmic contact means are respectively disposed on the outer shell-like region of the first spherical body section and the second spherical body section. An annular fillet of insulating material is interposed between the perimeter portion of the second ohmic contact means and the juncture between the larger first spherical body section and the second spherical body section to protect the terminus of the semispherical p-n junction, the annular insulating fillet encircling the second spherical body section.

Light emitting diodes as those described above may then be placed in an array to form a display. Such a display would further place the light emitting diodes in a glass slurry insulating material having a transparent conductive material connecting each diode into a segment with a series of segments forming an alphanumeric character, for example A method for fabricating light emitting diodes and light emitting diode displays includes forming a plurality of substantially spherical bodies, arranging the substantially spherical bodies into a desired array and embedding the same into a viscous insulation material. After hardening the insulation material, selected etching is then performed upon the substantially spherical body to allow for the application of junction protection insulation and metal ohmic contact means. A transparent conductive material is then layered over the resulting structure to provide parallel electrical connections.

BRIEF DESCRIPTION OF THE DRAWINGS

FIG. 1 shows a sectional view of a portion of an array illustrating the structural details of a semispherical light emitting diode of the present invention;

FIGS. 2a-2b are elevational views of an seven segment or character display made from an array of semispherical light emitting diodes of the present invention;

FIGS. 3a-3h illustrates a process for fabricating a display from semispherical light emitting diodes;

DETAILED DESCRIPTION OF THE DRAWINGS

Figure 4:
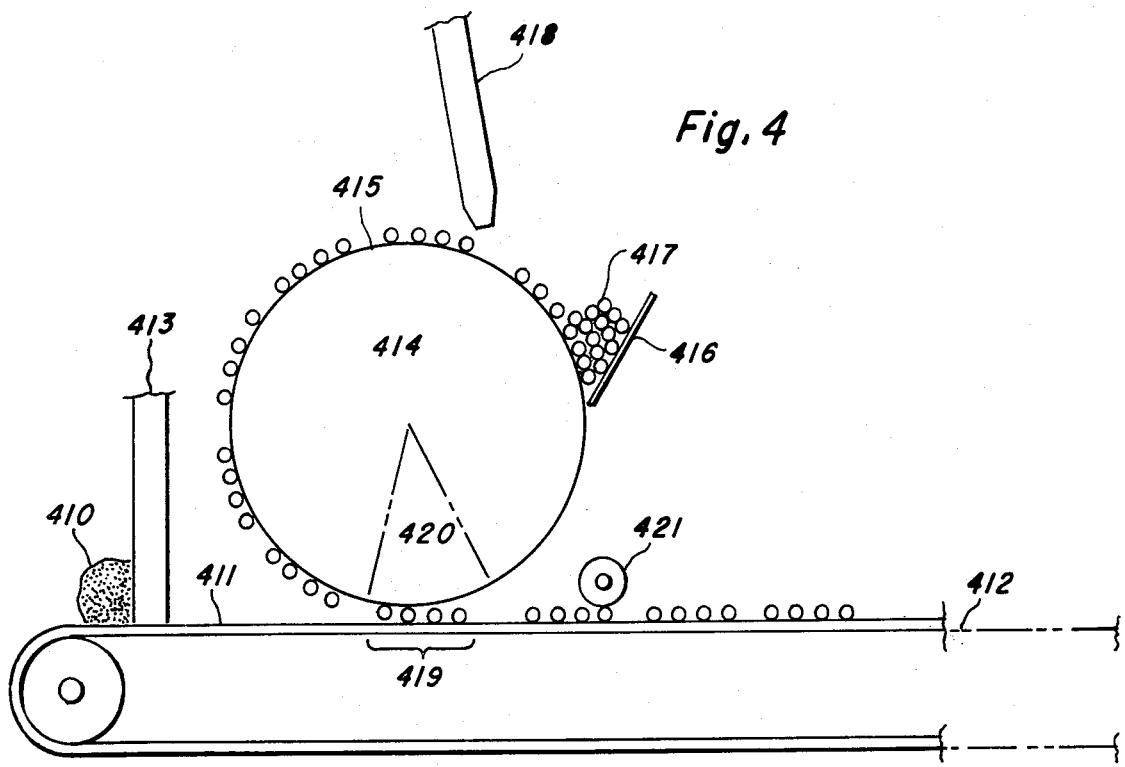
FIG. 4 shows a method whereby spheres are embedded in an insulation matrix in a uniform array by a continuous process.

Referring now to the figures and more particularly to FIG. 1, a portion of a display 10 is shown. A semispherical light emitting diode (LED) 11 has been cast into a insulating member 12, where such insulating member may comprise a glass such as Corning type 7052. In the embodiment illustrated in FIG. 1, the LED 11 is made from a body 13 of a compound semiconductor as p-type gallium arsenide, which when diffused with an appropriate dopant forms an outer substantially semispherical shell-like region 14 having a conductivity different from said body 13, such outer-shell region may be an n-type compound semiconductor as a gallium arsenide layer. A p-n junction 15 is thus formed at the junction of the two conductivity types. Selective etching of the outer shell-like region 14 results in exposure of the n-type material 14 on one side of the diode element 11 and exposure of the p-type gallium arsenide body 13 on the other side of the diode element 11. As a result, the body has first and second sections of different diameters. An annular fillet 16 comprised of glass material such as Innotech 760 protects the p-n junction 15. Ohmic contact is made through the p-type gallium arsenide body 13 by a conductive layer 17 which may be of a metal substance, and to the n-type gallium arsenide layer 14 by a metal dot 18. In the display 10 all of the diode cathodes, i.e., n- type gallium arsenide layers 14 are connected in parallel by means of a transparent conductive layer 19 which may consist of tin oxide, cadmium stannate or indium oxide.

Referring now to FIGS. 2a and 2b where in FIG. 2a a backside view of one embodiment of a display using an array of light emitting diodes such as the light emitting diode exemplified in FIG. 1 is shown. The display 20 is comprised of seven segments 21a–21g. Each segment consists of four semispherical light emitting diodes such as described above, which are interconnected by a conductor 22 which may be a metal strip. The strips adhere to the glass casting matrix 23 and serve as ohmic contacts to the light emitting diode anodes. In addition, these strips connect each segment to a corresponding bonding pad 24. The front side of the display 20 is shown in FIG. 2b. A transparent conductive layer 25, tin oxide, for example, covers the entire light emitting diode array and adheres to the glass casting matrix 23. In addition, the transparent conductive layer 25 provides a parallel electrical connection to the cathode ohmic contacts 26 and a common electrical contact to a bonding pad 27.

If the desired light emitting diodes segments are forward biased by applying the correct voltages to bonding pads 24 and 27, the selected light emitting diodes will emit visual light to form a numeral. For example, if bonding pad 27 is grounded and a voltage of +3 volts is applied to segments 21a, 21b, 21c, 21d, and 21g via the bonding pads 24, the numeral "3" will appear as illustrated by the white circles in FIG. 2b.

Turning now to FIGS. 3a–3h, process steps are illustrated wherein a structure such as shown in FIG. 1 can be produced and assembled into a regular array such as the display shown in FIG. 2.

The first step of such a process is shown in FIG. 3a where a sphere of gallium arsenide is provided. It should be recognized that other shapes could be used equally well, so spheres are only one example of an embodiment of the invention. Also, any one of several methods could be used to form such spheres or spheroids; the method chosen shall depend on such factors such as cost, purity of material required, degree of single crystallinity required, etc. Spheres or spheroid crystallites have been made by grinding, spraying, growth from the vapor phase and precipitation from a saturated solution. In addition, spherical gallium arsenide can be formed in a shotting process. FIG. 3b illustrates a sphere 200 having a diffused layer 210 forming a skin of the opposite conductivity type. Continuing, the process illustrated in FIG. 3c the spheres 200 are arranged and held in a desired array by means of a vacuum plate 212 having a regular array of holes 214. Excess spheres are placed on the vacuum plate while it is held upside down with vacuum applied. The holes are filled with spheres, and the surplus spheres are removed by shaking or by a gentle stream of compressed air (not shown). The spheres are then dropped into a viscous glass slurry film 216 by releasing the vacuum on the vacuum plate 212. The glass film 216 can be made by casting a slurry of glass powder, such as −325 mesh Corning type 7052, binder, and solvent onto a smooth surface with a doctor blade. If necessary, the spheres 200 can be pressed into the glass film 216 with a suitable roller or pressure plate. The film of spheres is then air dried, baked in an oven, and fired in a furnace. A further method of placing the spheres into a glass slurry material is illustrated in FIG. 4 where fabrication can be made even less expensive when the spheres are embedded in the casting matrix in a uniform array by a continuous process. In FIG. 4 a glass slurry 410 is continuously cast into a film 411 on a conveyor belt 412 by means of a casting head 413. Spheres are loaded onto a vacuum drum 414 which is fitted with a sheet 415 which is perforated with holes in a regular array. Loading is accomplished with a plate 416 which has one edge tightly pressed against the drum and which contains a plurality of spheres 417. A gentle stream of air is directed from nozzle 418 to remove surplus spheres. When a uniform array of spheres such as the four spheres 419 shown setting on the conveyor belt 412 is directly above the glass slurry film 411, a vacuum release wedge 420 causes the spheres to drop into the glass slurry 411. If necessary, a roller 421 presses the spheres further into the glass slurry 411.

Returning to the process illustrated in FIGS. 3a–3h and more specifically to FIG. 3e, a selective etch is used to expose the p-n junction 218. The etch is one which will remove gallium arsenide but which will not attack or remove glass. An example of such an etch is an aqueous solution of hypochlorous acid.

Proceeding to FIG. 3f, the p-n junctions 218 are protected by a glass material such as Innotech 760. A slurry of this junction protection glass is spread onto the casting matrix 216, where it collects around the spheres 200 and forms an annular a fillet 220. After drying and firing at a suitable temperature, a light HF etch is used to remove all traces of glass from the tops of the spheres 200. The junction protection glass must of course fire at a lower temperature than the casting matrix glass 216.

FIG. 3f illustrates the ohmic contacts made to the cores of spheres 200 by sputtering, evaporating, or ion plating a metallic strip 222. The metal strip 222 may be of a gold material for example, serving to interconnect the spheres as desired and to provide a current path.

Although gallium arsenide has been used as an example of a material which can provide a light emitting p-n junction it is understood that other materials can serve as well. Depending upon the type of material used, the metal contact 222 may or may not require a heat treatment after deposition in order to form an ohmic contact. It should also be recognized that if a heat treatment is not required to form a ohmic contact, other materials then glass could be used in the supporting matrix. In particular, an uncured organic polymer could be used in place of the glass matrix 216. Fabrication would be essentially the same except that the polymer would be cured rather than fired as was the case with the glass. Further, the etch used to completely expose the sphere cores could be replaced by sandblasting or lapping and the metal strips 222 might be deposited by electroless plating rather than the vacuum techniques mentioned above.

Finally, the glass matrix 216 is etched back on the bottom with HF, and metal dots 224 are sputtered, evaporated, or ion plated onto the diffused layers 210. A transparent conductive layer 226 as for example tin oxide, is then deposited over the entire array.

The conductive layers 224 and 226 can be placed in restricted and defined areas of the display in several ways. Since the vacuum plate 212 is used to make a predefined, regular array of light emitting diodes, various masks can be used in subsequent steps of the fabrication. For example, the metals 224 and 226 can be selectively placed by using shadow masks during evaporation. Alternatively, a metal can be deposited over the entire surface and standard photomasking techniques can be used in conjunction with a metal etched to selectively remove all but the desired metal pattern. It is also recognized that the ability to use photomasking techniques or silk screen processes may allow modifications of the fabrication process illustrated in the FIGS. 3a-3b made possible by the regularity of the array. For example, glass can be selectively removed from the sphere cores in FIG. 3f by these techniques.

In addition to the process and material alternatives mentioned above, the present invention includes several other aspects.

As mentioned above, gallium arsenide is taken only as an illustrated example. Included in the present invention are other semiconductors such as GaP, GaAsP, SiC, and a host of others well known to those skilled in the art. Additionally, the present invention can be embodied in the form wherein a light emitting diode which emits light only in the infared region of the spectrum as modified by the intimate-placement of a phosphor. Such materials, which absorb two or more long wavelength quanta and re-emit one quantum at shorter wavelengths, are also well known to those skilled in the art. Also, the present invention can be embodied in a form in which the semiconductor base used to produce a p-n junction is grown epitaxially on a spherical body having a suitable crystal structure. For example, GaP or GaAs could be grown on a geranium body. This embodiment would be particularly advantageous because of the comparative ease of forming germanium shot in a shot tower. In addition, the present invention can be embodied in a form in which the transparent conductive layer of tin oxide is replaced with other transparent conductive oxides such as indium oxide, or with a transparent conductive metal film such as a few hundred angstroms of gold or platinum. Furthermore, the present invention can be embodied in a form in which the transparent conductive layer is omitted and a metal grid is used to contact the spheres over a small area. Also, the present invention can be embodied in a form in which the metal dots used to contact the spheres are omitted and a transparent conductive material is used to make ohmic contact.

What is claimed is:

1. A light-emitting diode elements having a substantially spherical shape comprising:
    a substantially spherical body having one conductivity type,
    an outer substantially spherical shell-like section having a second conductivity type disposed on said spherical body and defining a p-n junction at the juncture between said spherical body and said outer shell-like section,
    first ohmic contact means disposed on said outer shell-like section, and second ohmic contact means disposed on said spherical body, and
    annular insulation means disposed between said outer shell-like section and said second ohmic contact means.

2. A light-emitting diode element as set forth in claim 1 wherein said spherical body comprises a first spherical section and a second spherical section having a smaller diameter than said first spherical section, where both first and second spherical sections are of one conductivity type.

3. A light-emitting diode element as set forth in claim 2 wherein said first and second spherical sections are made from a p-type gallium arsenide.

4. A light-emitting diode element as set forth in claim 1 wherein said outer substantially spherical shell-like section comprises an N-type gallium arsenide material.

5. A light-emitting diode element as set forth in claim 1 further including a transparent conductive means disposed over said outer substantially spherical shell-like section for providing a current path.

6. A light-emitting diode element as set forth in claim 5 wherein said transparent conductive means comprises a tin oxide layer.

7. A light-emitting diode element as set forth in claim 5 wherein said transparent conductive means comprises an indium oxide layer.

8. A light-emitting diode element as set forth in claim 5 wherein said transparent conductive means comprises a metal grid.

9. A light-emitting diode element as set forth in claim 5 wherein said transparent conductive means comprises a cadmium stannate layer.

10. A light-emitting diode element as set forth in claim 1 wherein said first ohmic contact means comprises a metal dot.

11. A light-emitting diode element as set forth in claim 1 wherein said second ohmic contact means comprises a metal layer.

12. A light-emitting diode display as set forth in claim 1 wherein said semiconductor body comprises a first spherical section and a second spherical section smaller than said first spherical section where both first and second spherical sections are of one conductivity type.

13. A light-emitting diode display as set forth in claim 8 wherein said insulating member comprises a glass material.

14. A light-emitting diode display as set forth in claim 8 wherein said insulating member comprises an organic polymer.

15. A light-emitting diode display as set forth in claim 8 wherein said second ohmic contact means comprises a metal strip.

16. A light-emitting diode display comprising:
    an array of diode segments having a plurality of substantially spherical light-emitting diodes disposed on an insulating support member having:
    a substantially spherical anode of a compound semiconductor material having one conductivity type,
    an outer substantially spherical shell-like cathode region on said anode having a second conductivity type,
    a first ohmic contact means disposed on said outer shell-like region providing ohmic contact to the cathode,
    a second ohmic contact means for connecting said plurality of light-emitting diodes and providing ohmic contact to the anodes of said diodes,
    transparent conductive means disposed over said plurality of diode segments adhering to said insulating support member and providing parallel electrical connection to said first ohmic contact means; and a common electrical contact to said second ohmic contact means.

17. A light-emitting diode display as set forth in claim 16 wherein said first and second ohmic contact means comprises bonding pads.

18. A light-emitting diode display as set forth in claim 16 wherein said transparent conductive means comprises a layer of tin oxide.

* * * * *